United States Patent [19]

Knoppel

[11] 4,150,253

[45] Apr. 17, 1979

[54] SIGNAL DISTORTION CIRCUIT AND METHOD OF USE

[75] Inventor: Curt A. Knoppel, Los Angeles, Calif.

[73] Assignee: Inter-Technology Exchange Ltd., Los Angeles, Calif.

[21] Appl. No.: 762,403

[22] Filed: Jan. 26, 1977

Related U.S. Application Data

[63] Continuation-in-part of Ser. No. 667,115, Mar. 15, 1976, abandoned.

[51] Int. Cl.² .............................................. H04R 3/00
[52] U.S. Cl. .................................. 179/1 R; 179/1 G; 84/1.19
[58] Field of Search ........... 179/1 D, 1 J, 1 G, 1 AT, 179/1 M, 1 R; 84/1.19, 1.22, 1.23, 1.24, DIG. 26; 323/101; 328/155

[56] References Cited

U.S. PATENT DOCUMENTS

| | | | |
|---|---|---|---|
| 2,315,249 | 3/1943 | De Rosa | 179/1 D |
| 2,379,714 | 7/1945 | Hollingsworth | 179/1 R |
| 3,327,046 | 6/1967 | Munch | 84/1.23 |
| 3,544,694 | 12/1970 | Freeman | 84/1.19 |
| 3,755,626 | 8/1973 | Lace | 179/1 D |
| 3,908,504 | 9/1975 | Deutsch | 84/1.19 |
| 3,973,461 | 8/1976 | Jahns | 84/1.19 |

Primary Examiner—Douglas W. Olms
Attorney, Agent, or Firm—Irving M. Kriegsman

[57] ABSTRACT

A method and apparatus are described for electronically processing sound. An electrical signal derived from audio information is split up into two separate signal paths. The signal travelling along one path is passed through an exciter circuit and an attenuator and is then combined with the signal travelling along the other path. In one embodiment of the invention the signals travelling along the two paths are combined electronically and in another embodiment of the invention the two signals are combined acoustically. The exciter circuit is made up basically of a high pass filter and a harmonic creator. The harmonic creator is designed to create low order, odd and even harmonics of frequencies whose amplitudes are above a preselected threshold level. Two versions of the exciter circuit are disclosed, one containing vacuum tubes and the other solid state. The quality and various other characteristics of sound that is processed according to this invention are believed to be greatly enhanced.

35 Claims, 8 Drawing Figures

SIGNAL DISTORTION CIRCUIT AND METHOD OF USE

CROSS-REFERENCE TO RELATED APPLICATION

This application is a continuation-in-part of patent application Ser. No. 667,115, filed Mar. 15, 1976 now abandoned.

BACKGROUND OF THE INVENTION

This invention relates to electronically processed sound. More particularly, this invention relates to a method and apparatus for enhancing the quality, clarity, presence, intelligibility and other characteristics of electronically processed sound. The invention is especially useful with, but not exclusively limited to, sound recording equipment, sound reproduction equipment, sound reinforcement equipment, sound analysis equipment and sound transmission equipment.

In U.S. Pat. No. 2,866,849 there is disclosed an apparatus for improving sounds of music and speech in which an audio signal is split into two signal paths and the signal in one path is passed successively through an amplifier, a 3KC high pass filter, a harmonic producer, a 6KC high pass filter and an amplifier and is then combined, either electrically or acoustically, with the signal in the other path.

In U.S. Pat. No. 2,852,604, there is disclosed a sound reproduction apparatus in which a monaural electrical signal is divided into two paths and the signal in one path is passed through a time delay mechanism. The two signals are then converted to sound through separate speakers.

In U.S. Pat. No. 3,219,757, there is disclosed a sound reproduction apparatus in which a monaural electrical signal is divided into two paths and the signal in one path is passed through a non-linear frequency dependent phase delay circuit. The two signals are then mixed in two different ways. One of the mixed signals is converted to sound through one speaker and the other mixed signal is converted to sound through another speaker.

In U.S. Pat. No. 3,560,656 there is disclosed a sound reproduction apparatus in which a monaural electrical signal is divided into two signal paths and the signal in one path is passed through a phase changing circuit. The two signals are then converted to sound through separate spaced apart speakers, with the sound emerging from both speakers having the same amplitude.

Other examples of electronic sound processing apparatus pertienent in one way or another to this invention may be found in U.S. Pat. Nos. 2,866,849; 2,953,644; 3,127,476; 3,591,699; 3,723,633; 3,745,254; 3,819,861; 3,828,133; and 3,890,466.

SUMMARY OF THE INVENTION

It is an object of this invention to provide a method and apparatus for improving the quality and other characteristics of electronically processed sound.

It is another object of this invention to provide an improved method and apparatus for processing sound electronically.

It is still another object of this invention to provide a new and improved electronic circuit which can be used in a most beneficial manner with electronic signal processing equipment.

It is yet still another object of this invention to provide an electronic signal processing apparatus and method that can be used in conjunction with sound recording equipment, sound analysis equipment and sound transmission equipment.

It is another object of this invention to provide electronic signal processing apparatus that is relatively inexpensive to fabricate and relatively easy to use.

it is still another object of the invention to provide a new and improved circuit for generating harmonics of an electrical equivalent of an audio signal.

In its broadest aspects, this invention involves generating a low amplitude signal containing low order, odd and even, phase shifted, frequency dependent and amplitude dependent harmonics of the signal being processed and then adding the signal so generated to the signal being processed.

According to this invention, a monaural electrical signals is divided into two separate paths. The signal in one path is passed through an exciter circuit and an attenuator, and is then combined with the signal travelling along the other path. In the exciter circuit the signal is passed first through a high pass filter and then through a harmonic creator. The harmonic creator is designed to create low order harmonics of frequency present that are above a preselected threshold. The combining of the signals travelling along the two paths is achieved either electronically or acoustically. The amount by which the excited signal is attenuated is dependent on the type of the audio information being processed and the ultimate use of the electronically processed information. In most cases where the sound being processed is music or speech, the excited signal is attenuated to about between 20% and 70% of the amplitude of the unaltered signal. It has been found that sound that is electronically processed according to this invention has improved quality, clarity, intelligibility, presence, depth and reality.

One of the principal features of the invention is that the excited signal and the unaltered signal can be combined electrically and then fed into a single output transducer or can be combined acoustically by being fed into separate output transducers.

The foregoing and other objects and advantages will appear from the description to follow. In the description, reference is made to the accompanying drawings which form a part thereof, and in which is shown by way of illustration, specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

DESCRIPTION OF THE DRAWINGS

In order that the invention may be more fully understood, it will now be described by way of examples with reference to the drawings wherein like reference numerals represent like parts and wherein.

DETAILED DESCRIPTION

Figure 1:
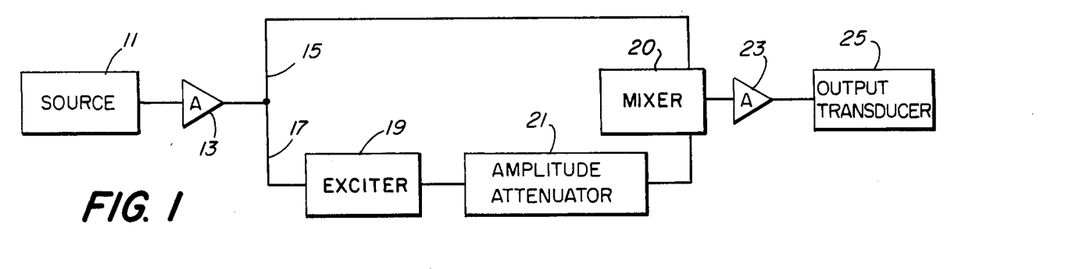
FIG. 1 is a block diagram of one embodiment of the invention.

In FIG. 1, there is shown a source 11 of monaural electrical signals. Source 11 may be a microphone, a radio tuner and amplifier combination, an electrical pickup from a record player or a magnetic sound head associated with a magnetic tape or any other device whose output is a monaural electrical signal. The output from source 11 is passed through an amplifier 13 and is then divided into two discrete signal paths 15 and 17. The signal travelling along path 17 is passed in succession through an exciter circuit 19, an amplitude attenuator 21 and is then combined in a mixer 20 with the signal travelling along path 15. The combined signal is passed through an amplifier 23 and then fed into an output transducer 25, such as a loudspeaker or a magnetic tape or an engraved disc or a paper print-out. The exciter circuit 19 includes high-pass filter means and harmonic creator means. The harmonic creator means is designed to create low order harmonics above a preselected threshold of frequencies passed by the high pass filter means.

Figure 2:
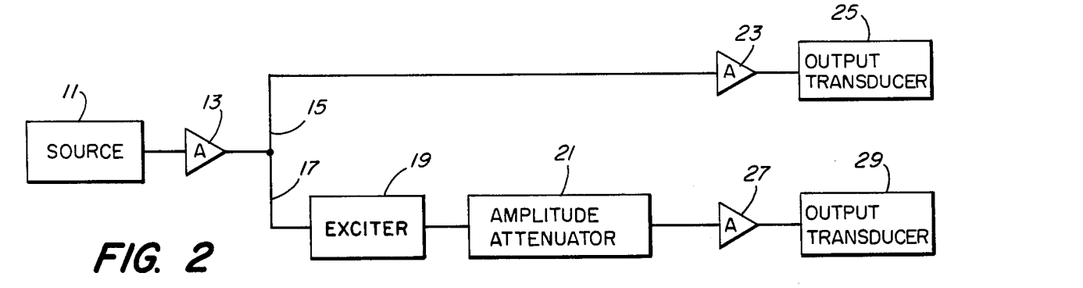
FIG. 2 is a block diagram of another embodiment of the invention.

In the FIG. 2 embodiment, the signal from the amplitude attenuator 21 is passed through an amplifier 27 to an output transducer 29 instead of being passed through the amplifier 23 and is then combined with the signal travelling along path 15 as in the FIG. 1 embodiment.

Figure 3:
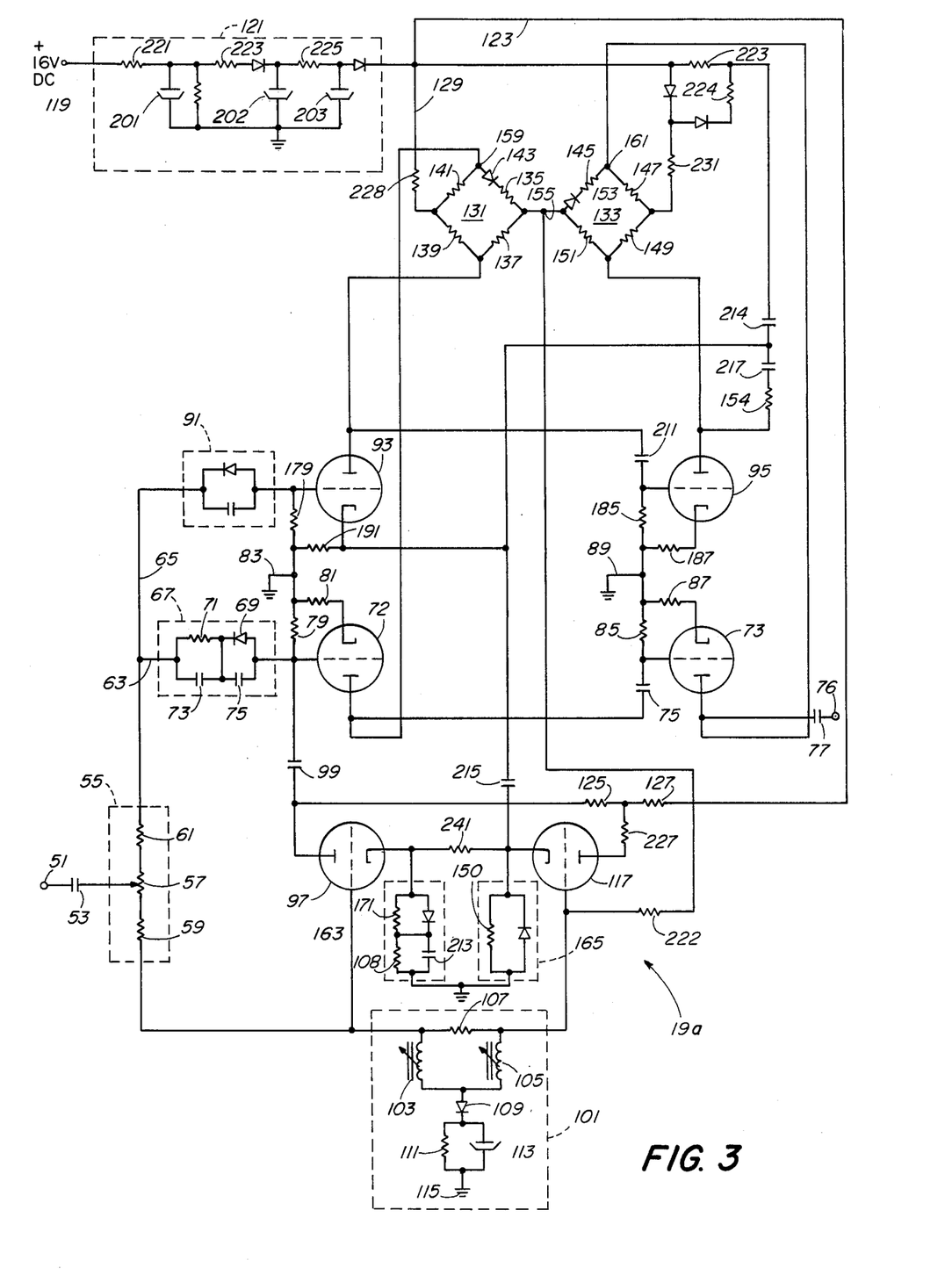
FIG. 3 is a circuit diagram of a vacuum tube version of the exciter circuit shown in FIGS. 1 and 2.

In FIG. 3 there is shown a schematic diagram of a vacuum tube version of the exciter circuit 19. The circuit 19 is made up basically of six triodes, a filter circuit, a signal splitting network, two bridge circuits and various auxiliary components.

A monaural electrical signal is applied to the exciter circuit 19 through input terminal 51. The signal emerging from the input terminal 51 is passed through a coupling capacitor 53 to a signal splitting network 55 which is made up of a balance potentiometer 57 and two fixed resistors 59 and 61.

The portion of the signal that is passed through fixed resistor 61 is split up into two separate paths 63 and 65. The signal travelling along path 63 is passed through a high pass filter 67 to the grid of a triode 73. The filter 67 is made up of a diode 69, a resistor 71 and two capacitors 73 and 75. The purpose of the filter 67 is to cut off certain base frequencies from the signal conducted to the grid of triode 72. The plate of triode 72 is connected to the grid of triode 73 through a coupling capacitor 75 and the plate of triode 73 is connected to the output terminal 76 of the phase shifting circuit 19 through a capacitor 77. Each one of the triodes 72 and 73 includes the standard associated components. Thus, triode 72 includes a grid leak resistor 79, a cathode resistor 81 and a ground 83. Similarly, triode 73 includes a grid leak resistor 85, a cathode resistor 87 and a ground 89. Thus, the signal travelling along path 63 is passed through filter 67 to the grid of triode 73 and the output of triode 73 is applied to the output terminal 75.

The portion of the signal travelling along path 65 is passed through a filter circuit 91 to the grid of a triode 93. The plate of triode 93 is connected to the grid of a triode 95.

The portion of the signal passed through fixed resistor 59 is applied to the grid of a triode 97. The output of triode 97 is applied through a coupling capacitor 99 to the input grid of triode 72. Because the signal applied to the grid of triode 72 has passed through triode 97 it has gone through a 180° phase reversal. Thus, the two signals applied to the grid of tube 72 are completely out of phase with each other.

Connected to the grid of triode 97 is an inductive circuit 101 whose purpose is to establish the phase slope. The inductive circuit 101 includes a pair of identical variable inductors 103 and 105, a resistor 107, a diode 109, a resistor 111, a capacitor 113 and a ground 115 and is connected to the grid of triode 117.

The supply voltage for the circuit is conducted through terminal 119 to a filter circuit 121 which filters out any ripple content present in the supply voltage and is then split up into three paths. One path 123 supplies the plate voltage to triode 97 and triode 117 through plate resistors 125 and 127. Another path 129 supplies voltage to bridges 131 and 133. Bridge 131 is made up of resistors 135, 137, 139, 141 and diode 143 and bridge 133 is made up of resistors 145, 147, 149, 151 and diode 153. The output of bridges 105 and 107 at junction 155 is applied to the grid of the tube 117. Junction of bridge 131 is connected to the plate of tube 72. Junction 161 of bridge 133 is connected to the plate of tube 73.

The exciter circuit 19 further includes cathode grounding networks 163 and 165.

Representative values and other information relating to the component parts of phase shifting circuit 19 as designed for application with sounds of speech and music are as follows:

| | |
|---|---|
| All triodes | 6K6112Wa |
| Inductors 103, 105 | KIP |
| Resistor 57 | 20K |
| All diodes | 1N3484 |
| Capacitors (electrolytic) | |
| 201, 202, 203 | 50mF/20V |
| 77 | 10mF/6V |
| 113 | 1mF/3V |
| Capacitors (non-polarized) | |
| 25, 53, 211 | 0.1mF |
| 213 | 0.05mF |
| 214 | 0.02mF |
| 215, 217 | 0.01mF |
| 73, 75, 76, 99 | 0.001mF |
| Resistors | |
| 221, 222 | 15K |
| 127, 223, 224, 225, 228, 231, 233 | 220 ohms |
| 135, 137, 139, 141, 145, 147, 149, 151 | 100K |
| 150 | 440K |
| 71, 171 | 10K |
| 79, 179, 85, 185 | 1M |
| 87, 187, 81 | 1.5K |
| 191, 111 | 4.5K |
| 107, 108 | 51K |
| 241 | 8.2K |
| 227, 125 | 220K |
| 61 | 220K |
| 59 | 4.7K |

Figure 4:
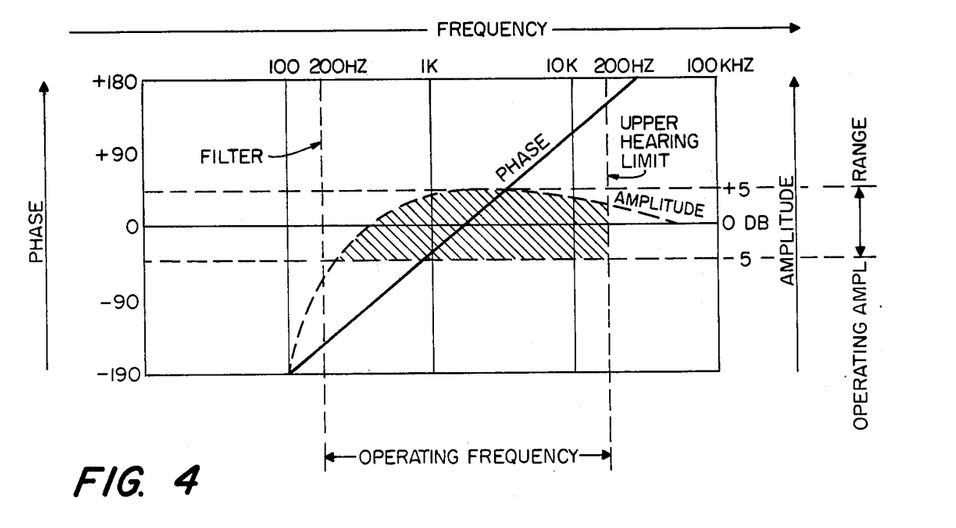
FIG. 4 is a graph illustrating the frequency dependent phase shifting characteristics of the exciter circuit in FIG. 3.

An audio plot depicting the frequency dependent phase shift and gain of the exciter circuit 19 of FIG. 3 for the values noted above is shown in FIG. 4. As can be seen the circuit 19 produces a linear frequency dependent phase shift of about 360° over a frequency range from about 100 HZ to about 22 KHZ with a gain of between ±5DB over a frequency range of about 200 HZ to at least 22 KHZ. The point of zero phase shift is about 2KHZ. Although it cannot be said with absolute certainty which specific elements in exciter circuit 19 perform which function, a comparison actually performed of the input and output waveforms of a circuit 19 actually constructed and tested has shown that the circuit 19 passes frequencies above a certain level and generates low order, odd and even, phase shifted and amplitude dependent harmonics of the frequencies so passed.

Figure 5:
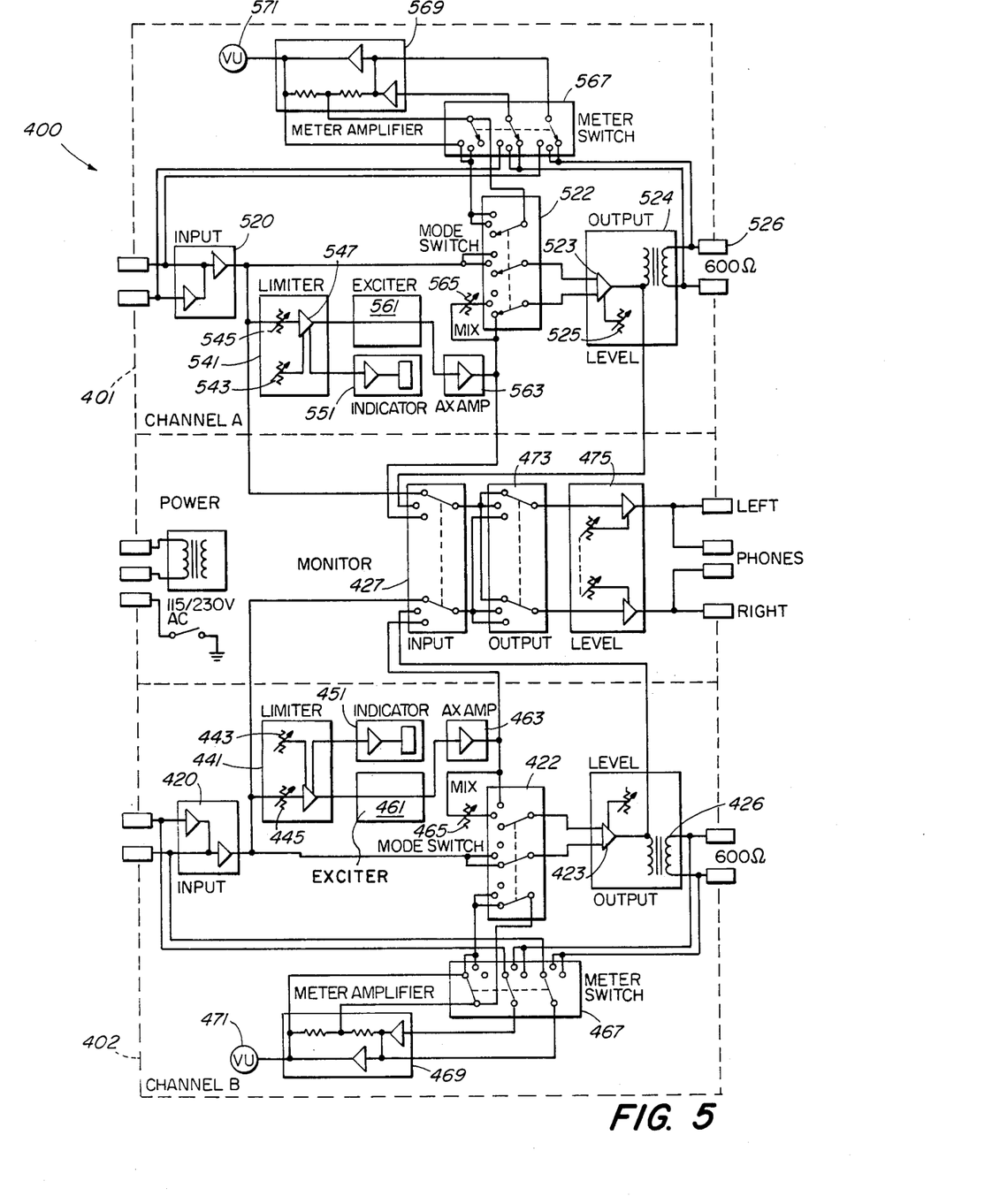
FIG. 5 is a block diagram of a two channel apparatus incorporating the invention.

In FIG. 5, there is shown in block diagram form an apparatus 400 according to this invention for processing two channels of monaural electrical signals. The apparatus 400 consists essentially of two processing channels, identified as channel 401 and channel 402 and a monitor section 403. The two channels 401 and 402 are essentially identical. In channel 402, a monaural electrical signal from an external source (not shown) is applied to input 420 which is an active transformer. The signal emerging from the input 420 is split into three separate parts. One part is fed into a switching circuit 422 which is connected to a buffer amplifier 423 at the output section 424. When the signal travels along this direct path, it is in the by-pass mode. Output 424 further includes a gain control 425 and an output transformer 426. A second part of the signal is fed into an input switching circuit 427 in the monitor section 403. The third part of the signal is fed into a peak limiter circuit 441 which is made up of a peak limiting control 443, a threshold control 445 and an amplifier 447. The signal emerging from the amplifier 447 is fed into an indicator circuit 451 and also into an exciter circuit 461 (which corresponds to the exciter circuit 19 of FIGS. 1 and 2). The output from the exciter circuit 461 is fed into an amplifier 463 which restores the signal to a level to compensate for losses occurring in passing through the exciter circuit 461. The output from the amplifier 463 is fed into an attenuator 465 and then into the switching circuit 422 where it feeds into either of the other two modes. In one of these modes a pure excited signal is fed into amplifier 423. In the third mode a mixed signal, that is a pure signal mixed with an attenuated excited signal is fed into amplifier 423. Thus, the signal emerging from output 424 can be selected so as to be either the original pure signal, an excited shifted signal or a mixture of the original signal and an excited signal. Channel 402 further includes a meter switch 467 and a meter amplifier 469 and an indicator 471.

Monitor section 403 further includes output section 473 and level section 475.

In channel 401 elements 520, 522, 523, 524, 525, 526, 541, 543, 545, 547, 551, 561, 563, 565, 567, 569 and 571 correspond to elements 420, 422, 423, 424, 425, 426, 441, 443, 445, 447, 451, 461, 463, 465, 467, 469 and 471 in channel 402.

As can be appreciated, the apparatus 400 can be used in basically any application where either one or two channels of audio information are being processed electronically. The apparatus 400 is particularly useful with sound recording equipment, sound reinforcing equipment and sound reproduction equipment.

Figure 6:
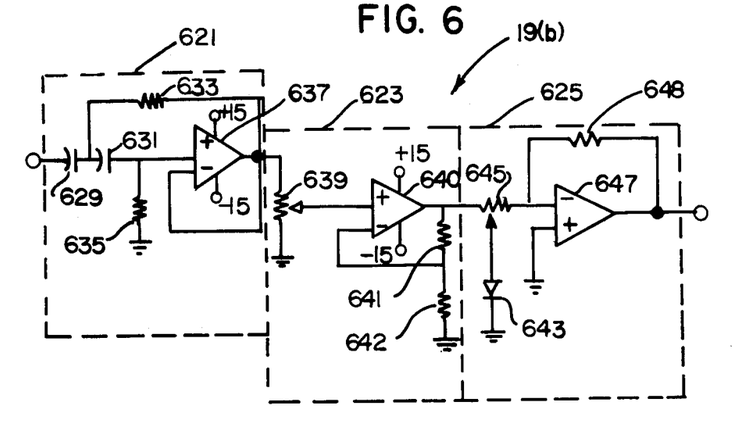
FIG. 6 is a circuit diagram of a solid state version of the exciter circuit shown in FIGS. 1 and 2.

In FIG. 6 there is shown a solid state version of the exciter circuit 19. The circuit comprises a filter 621, a variable gain amplifier 623 whose output is coupled to the output of the filter 621 and a harmonic creator 625 whose output is coupled to the output of the variable gain amplifier 623.

The filter 621 is a 2-pole slow roll off Butterworth high pass filter and is made up of two capacitors 629 and 631, a pair of resistors 633 and 635 and an operational amplifier 637. The frequencies passed by the filter 621 are fed into the variable gain amplifier 623 which allows the level to the next element, namely the harmonic creator, to be varied. The variable gain amplifier 623 includes an adjustable potentiometer 639 and an operational ampifier 640 and a pair of resistors 641 and 642.

The harmonic creator 625 includes a diode 643, an adjustable potentiometer 645 and an operational amplifier 647 and a resistor 648. The harmonic creator 625 utilizes the voltage to current characteristics of the diode 643 to softly clip the peaks of the incoming signal at a threshold determined by the adjustable potentiometer 645. By clipping the peaks softly only low order harmonics are created. By selecting the proper threshold only transient portions of the signal become clipped. By clipping the signal on one side only both odd and even harmonics are created.

Representative values and other information relating to the component parts of the exciter circuit 19 of FIG. 6 as designed for application with sounds of speech and music are as follows:

| Element | |
| --- | --- |
| 621 | 4KHZ, 2 pole, high pass |
| 629 | 0.01μf |
| 631 | 0.01μf |
| 633 | 56K |
| 635 | 27K |
| 637 | #4131 |
| 639 | 10K |
| 640 | ½#4558 |
| 641 | 10K |
| 642 | 1K |
| 643 | 1N914 |
| 645 | 10K |
| 647 | ½#4558 |
| 648 | 47K |

Figure 7:
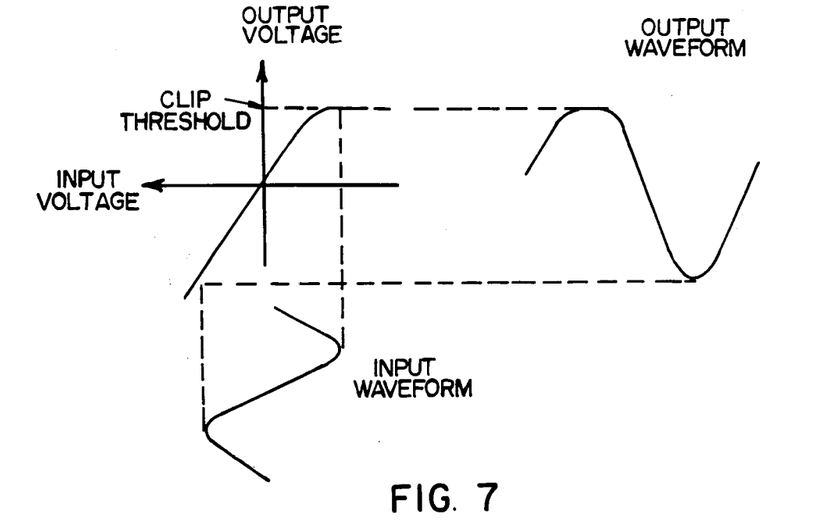
FIG. 7 is a plot of the transfer function of the harmonic creator in FIGS. 6.
Figure 8:
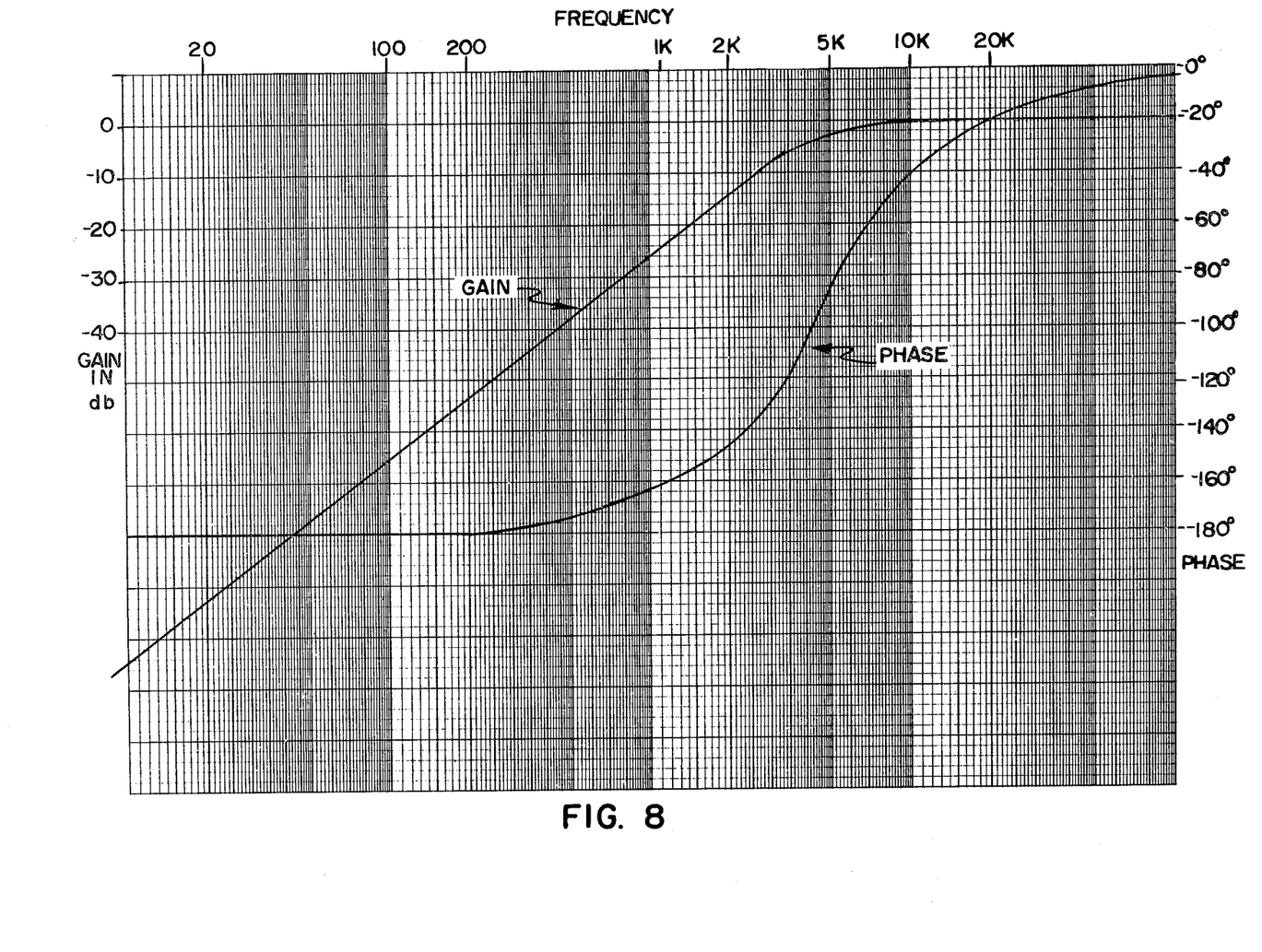
FIG. 8 is a plot of the gain and phase of the signal emerging from the high pass filter in FIG. 6.

The transfer function of the harmonic creator 625 for the values above is shown in FIG. 7 and the gain and phase of the signal emerging from the filter 621 for the values above is shown in FIG. 8. It is believed that the phase change in the signal resulting from passing the signal through the filter produces a directional or "third dimensional" effect in the resulting sound.

It will be understood that various changes in the details, materials, arrangements of parts and operating conditions which have been herein described and illustrated in order to explain the nature of the invention may be made by those skilled in the art within the principles and scope of the invention.

What is claimed is:
1. A method of improving the quality of electronically processed sounds of music and speech comprising:
 (a) splitting the audio signal representative of the sound into two signal paths;
 (b) passing the signal in one of the paths through a high pass filter designed to shift the phase of the signal passed in a frequency dependent manner;
 (c) passing those frequencies in the output signal of the high pass filter whose amplitudes are above a preselected level into a harmonic creator, the level of the input to the harmonic creator varying di- rectly with the level of the output from the high pass filter;

(d) attenuating all frequencies in the signal emerging from the harmonic creator a uniform amount to the level below the level of the signal in the outer path; and (e) combining the attenuated signal containing the harmonics and the fundamental frequencies from which the harmonics are created with the signal in the other path.

2. The method of claim 1 and wherein the preselected level is set to pass only transients to the harmonic creator.

3. The method of claim 2 and wherein the attenuated signal is attenuated to between 20% and 70% of the level of the signal in the other path.

4. The method of claim 1 and wherein the two signals are combined electrically.

5. The method of claim 1 and wherein the two signals are combined acoustically.

6. A method of imroving the quality of a wide bandwidth signal containing frequencies within the audio frequency spectrum comprising:

(a) splitting said wide band width signal into two signal paths;

(b) passing the signal in one of the paths through a high pass filter designed to filter out those frequencies in the extremely low frequency range, the frequencies passed being shifted in phase in a frequency dependent manner;

(c) passing the output signal emerging from the high pass filter through a harmonic creator, the output signal from the harmonic creator including the phase shifted fundamental frequencies; the input to the harmonic creator being level dependent on the output level of the high pass filter, all frequencies a uniform amount in the output signal from the harmonic less than the level of the signal in the other path without changing the level of the signal in the other path; and (e) combining the signals in both paths.

7. A method of improving the quality of an audio signal containing frequencies within the audio frequency spectrum comprising:

(a) splitting said audio signal into two signal paths;

(b) passing the signal in one path through a phase shifting high pass filter designed to pass all frequencies in the audio frequency level except for those in the bottom portion of the audio frequency spectrum;

(c) passing the signal emerging from the high pass filter through an amplitude threshold setting means;

(d) passing the signal emerging from the amplitude threshold setting means through a harmonic creator, the level of the input to the harmonic creator varying directly with the level of the output from the high pass filter;

(e) passing the signal emerging from the harmonic creator through an attenuator, the output signal from the attenuator including the fundamental frequencies; and (f) combining the signals in both paths.

8. The method of claim 7 and wherein the amplitude threshold setting means is set so as to only pass transients.

9. The method of claim 7 and wherein the harmonic creator is designed to generate odd and even harmonics.

10. A method of transmitting sounds of music and speech comprising:

(a) converting said sound into an audio signal;

(b) splitting said audio signal into two signal paths;

(c) filtering out of the signal in one of the paths frequencies below about 200 HZ and shifting the phase in a frequency dependent manner of the frequencies remaining;

(d) removing from the frequencies remaining, those frequencies whose amplitudes are below a preselected amplitude level;

(e) generating harmonics of the frequence that are then remaining, the level of the harmonics varying directly with the level of the frequencies from which they are created;

(f) attenuating the generated harmonics and the fundamental frequencies from which the harmonies are created to a lower level than the level of the signal in the other path; and (g) combining the attenuated signal with the signal in the other path.

11. A circuit for use with audio signal processing apparatus comprising:

(a) a high pass filter which is designed to shift the phase of the frequencies passed in a frequency dependent manner;

(b) a harmonic creator for generating harmonics of frequencies passed therethrough;

(c) means coupled between the high pass filter and the harmonic creator for passing into the harmonic creator only those frequencies in the output of the high pass filter above a preselected amplitude level; and (d) an attenuator coupled to the output of the harmonic creator for attenuating uniformly all frequencies in the output of the harmonic creator.

12. The circuit of claim 1 and wherein the high pass filter is a 1 KHZ high pass filter.

13. The circuit of claim 1 and wherein the high pass filter is a 4 KHZ high pass filter.

14. The circuit of claim 1 and wherein the high pass filter has a maximum phase shift which approaches 180°, a minimum phase shift which approaches 0°, a maximum phase shift at low frequencies and an attenuation rate of 12 db per octave.

15. The circuit of claim 1 and wherein the means coupled between the high pass filter and the harmonic creator is a variable gain amplifier.

16. The circuit of claim 15 and wherein the variable gain amplifier is set to pass only transients.

17. A method of improving the quality of an audio signal transmitted over a large bandwidth having a lower end at around 0 HZ comprising:

(a) generating from said audio signal an auxiliary audio signal containing harmonics of all those frequencies in the main audio signal above the extremely low frequency band and the fundamental frequencies from which the harmonics are based, said harmonics and said fundamental frequencies being shifted in phase in a frequency dependent manner from their corresponding frequencies in the main audio signal, being level dependent on the level of the frequencies corresponding to the fundamental frequencies in the main audio signal and lying within the large bandwidth;

(b) attenuating the auxiliary audio signal to a level below the main audio signal; and (c) combining the two signals.

18. Apparatus for use in processing sounds of music and speech comprising:
   (a) means for converting said sound into an audio signal;
   (b) means for dividing said signal into two signal paths;
   (c) a frequency dependent, phase shifting, high pass filter disposed along one path for filtering out frequencies in said path below a particular frequency level;
   (d) a harmonic creator;
   (e) means coupled between the output of the high pass filter and the input of the harmonic creator for controlling the input to the harmonic creator in accordance with the amplitude level of the output signal from the high pass filter;
   (f) an attenuator at the output of the harmonic creator for attenuating all frequencies in the output signal a uniform amount; and
   (g) means for combining the signals travelling along each path.

19. The apparatus of claim 18 and wherein the high pass filter is a 1 KHZ high pass filter.

20. The apparatus of claim 18 and wherein the high pass filter is a 4 KHZ high pass filter.

21. The apparatus of claim 18 and wherein the high pass filter is designed to pass all frequencies in the audio spectrum down to around 200 HZ.

22. The apparatus of claim 18 and wherein the high pass filter has a maximum phase shift which approaches 180°, a minimum phase shift which approaches 0°, a maximum phase shift a low frequencies and an attenuation rate of 12 db per octave.

23. The apparatus of claim 18 and wherein the means coupled between the high pass filter and the harmonic creator is designed to pass to the harmonic creator frequencies in the signal whose amplitudes are above a preselected amplitude and reject frequencies whose amplitudes are below said preselected amplitude.

24. The apparatus of claim 18 and wherein the means coupled between the output of the high pass filter and the harmonic creator is a variable gain amplifier.

25. The apparatus of claim 18 and wherein the means for combining the two signals are separate transducers.

26. The apparatus of claim 18 and wherein the means for combining the two signals is a single transducer.

27. The apparatus of claim 18 and wherein the harmonic creator is designed to generate odd and even harmonics.

28. The apparatus of claim 24 and wherein the variable gain amplifier includes an adjustable potentiometer, an operational amplifier and a pair of resistors.

29. A method of improving the quality of sounds of speech and music processed electronically comprising:
   (a) splitting an audio signal representative of said sound into two signal paths;
   (b) passing the signal in one of the paths through a phase shifting, high pass filter;
   (c) passing the output signal from the high pass filter into a harmonic creator;
   (d) passing the signal emerging from the harmonic creator through an attenuator designed to lower the level of all frequencies present a uniform amount; and
   (e) combining the attenuated signal with the signal in the other path.

30. The method of claim 29 and wherein the high pass filter is designed to pass all frequencies in the audio spectrum above the extremely low frequency range.

31. The method of claim 29 and wherein the signal passed to the high pass filter includes only those frequencies above a preselected level.

32. The method of claim 29 and wherein the level of the input signal to the high pass filter varies directly with the output level of the high pass filter.

33. Apparatus for use in processing an audio signal derived from sounds of music and speech comprising:
   (a) means for dividing the audio signal into two signal paths;
   (b) a phase shifting, high pass filter disposed along one path for receiving the signal traveling along that path and designed to pass all frequencies contained therein down to at least below 4 KHZ;
   (c) a harmonic creator coupled to the output of the high pass filter;
   (d) an attenuator coupled to the output of the harmonic creator and adapted to lower the level of all frequencies present in the output signal from the harmonic creator a preselected uniform amount without altering the level of the signal in the other path; and
   (e) means for combining the output signal from the attenuator with the signal in the other path, the output signal from the attenuator including the fundamental frequencies from which the harmonics were created.

34. The apparatus of claim 33 and wherein the phase shifting, high pass filter is designed to shift the phase of the frequencies passed in a frequency dependent manner.

35. A method of improving the quality of an audio signal derived from sounds of music and speech comprising:
   (a) deriving from said audio signal an auxiliary audio signal of the same content;
   (b) passing the auxiliary audio signal through a phase shifting, high pass filter designed to pass all frequencies present down to at least below 4 KHZ;
   (c) passing the output signal from the high pass filter whose frequencies are above a preselected level through a harmonic creator;
   (d) passing the output signal from the harmonic creator through an attenuator so as to lower the level of all frequencies present in the output signal of the harmonic creator a uniform preselected amount without altering the level of the audio signal from which the auxiliary audio signal was derived, the output signal from the attenuator including the fundamental frequencies from which the harmonics were created; and
   (e) combining the output signal from the attenuator, including the fundamental frequencies, with the audio signal from which the auxiliary audio signal was derived.

* * * * *